United States Patent
Sinnett et al.

(10) Patent No.: US 8,138,924 B2
(45) Date of Patent: Mar. 20, 2012

(54) ROBUST MOUNTING FOR RFID TRANSPONDER ANTENNA

(75) Inventors: Jay C. Sinnett, Greenville, SC (US); Cameron E. Smith, Greenville, SC (US); John David Adamson, Simpsonville, SC (US)

(73) Assignee: Michelin Recherche Et Technique, Granges-Paccot (CH)

( * ) Notice: Subject to any disclaimer, the term of this patent is extended or adjusted under 35 U.S.C. 154(b) by 1029 days.

(21) Appl. No.: 11/792,906

(22) PCT Filed: Mar. 9, 2005

(86) PCT No.: PCT/US2005/007723
§ 371 (c)(1),
(2), (4) Date: Mar. 26, 2008

(87) PCT Pub. No.: WO2006/098710
PCT Pub. Date: Sep. 21, 2006

(65) Prior Publication Data
US 2008/0192451 A1 Aug. 14, 2008

(51) Int. Cl.
*G08B 13/14* (2006.01)
*H01Q 1/50* (2006.01)
(52) U.S. Cl. .......... 340/572.7; 340/572.8; 343/850; 343/857; 343/870; 343/873
(58) Field of Classification Search .......... 340/572.7
See application file for complete search history.

(56) References Cited

U.S. PATENT DOCUMENTS

| | | | |
|---|---|---|---|
| 6,100,804 A * | 8/2000 | Brady et al. | 340/572.7 |
| 6,546,982 B1 | 4/2003 | Brown et al. | |
| 6,581,657 B1 | 6/2003 | Brown | |
| 6,624,748 B1 | 9/2003 | Phelan et al. | |
| 6,699,344 B2 | 3/2004 | Sergel et al. | |
| 6,885,291 B1 * | 4/2005 | Pollack et al. | 340/445 |
| 2003/0132893 A1 | 7/2003 | Forster et al. | |
| 2004/0017291 A1 | 1/2004 | Hardman et al. | |

FOREIGN PATENT DOCUMENTS
EP  1 589 614  10/2005
EP  1 632 369  3/2006

OTHER PUBLICATIONS

Supplemental European Search Report for EP 05 72 5084, dated Jul. 15, 2009.

* cited by examiner

*Primary Examiner* — Donnie Crosland
(74) *Attorney, Agent, or Firm* — Dority & Manning, P.A.

(57) ABSTRACT

A strain-resistant electrical connection and a method of making the same is provided. An antenna (36, 38) or other conductive lead is connected to a circuit (32) in a manner that makes the connection more resistant to mechanical stresses such as movement or rotation of the antenna (36, 38) or conductive lead relative to the circuit (32). The antenna (36, 38) or conductive lead is at least partially coiled to provide additional ability to withstand mechanical stresses. The antenna (36, 38) or conductive lead may be encase along with is connected circuit in an elastomeric material.

21 Claims, 2 Drawing Sheets

ROBUST MOUNTING FOR RFID TRANSPONDER ANTENNA

TECHNICAL FIELD OF THE INVENTION

The present invention relates to a strain and/or fatigue-resistant antenna connection and a method of making the same. More specifically, the present invention provides for a robust connection at an antenna connection point associated with an RFID device that makes the connection more resistant to fatigue failure caused by mechanical stresses such as movement or rotation of the antenna relative to the circuit. In the present invention, the antenna may be coiled or otherwise shaped to provide additional ability to accommodate mechanical strain without failure In certain embodiments, an elastomeric material may be configured around the antenna and the RFID circuit so as to create a protective region for the antenna and RFID device.

BACKGROUND OF THE INVENTION

Electronics integrated within a tire or other product offer potential advantages such as asset tracking and measurement of physical parameters as, for example, temperature and pressure. Often many of these systems rely on a wireless data link to communicate with an information system outside of the vehicle. Such information systems may include, as non-limiting examples, on-board computer systems, drive-by interrogators, or hand-held interrogators. In addition, the types of data communicated over such wireless data links are wide and varied and include such as not only the previously mentioned temperature and pressure but also other physical parameters such as tire rotation speed as well as data corresponding to manufacturing data and a host of other information. What ever the type of data transmitted, the wireless data link requires an antenna to be attached to the electronics in the tire. If the electronics and/or antenna are adhered to the tire rubber, flexing of the tire, either due to the tire building process or normal use can cause the antenna to separate from the electronics due to cracking, breaking, or fatigue.

The present invention primarily concerns physical factors such as mechanical stress leading to fatigue, which in turn can cause a circuit malfunction by physically breaking or weakening a specific part of the circuit. A typical location for such malfunction is at or near the point of connection of a wire, lead, or other conductor to an electrical circuit. In circumstances where the wire and the connected-to circuit may move or rotate relative to one another, the wire may incur a concentration of mechanical stress and/or fatigue at or near the point of connection to the circuit. Mechanical stresses such as repeated bending or twisting, for example, can lead to a weakening of the wire until a break occurs.

FIG. 1 provides an example of the problem addressed. In FIG. 1, lead 20 is connected to a printed circuit board 22 by a soldered connection 24. As lead 20 is twisted (as illustrated by arrow A), repeatedly bent (as illustrated by arrows B and C), or placed into tension or compression (arrow D), a concentration of stress occurs at or near the point of connection 26. Over time, as lead 20 is exposed to repeated mechanical cycles that provide for this concentration of stress, lead 20 may eventually weaken due to repeated deformation or cyclical movement. As a result, lead 20 will likely suffer a fatigue failure (or break) either at or near point of connection 26.

SUMMARY

Various features and advantages of the invention will be set forth in part in the following description, or may be apparent from the description.

The present invention provides a robust electrical connection for an antenna for an RFID device and a method of creating such connection that is resistant to mechanical stresses that can occur when a wire or lead is twisted or caused to bend repeatedly about its connection to a circuit. Generally speaking, with the present invention, methodologies are provided that provide a reduction in the stress and strain involving an antenna near its point of connection to an RFID device although, of course, the same principles may be applied to any electrical connection to any electrical device without limitation to antennae and RFID devices. In a first exemplary embodiment of the present subject matter, antenna elements are provided that include at least a coiled portion near the connection point to the RFID device.

In one exemplary method of the present invention, a process for creating a fatigue-resistant antenna connection is provided in which a coiled wire antenna is soldered or otherwise secured to an anchor point such that at least a portion of the coils of the coiled wire antenna are free of solder, or other securing agent, allowing some amount of stretching in the non-secured coils to allow reduced stress and/or strain on the actual antenna connection point.

In another exemplary embodiment of the present subject matter, methodologies are disclosed allowing the coupling of differing form factor wires to be used as antenna components for RFID devices.

In still another exemplary embodiment of the present subject matter, a temporary mounting configuration is provided lends support to the antenna and RFID devices during a manufacturing process.

In yet another exemplary embodiment of the present subject matter, the RFID device and antenna elements are encased in an elastomer material to provide physical protection for the RFID device as well as to assist in lessening stress on the antenna to RFID device connection point.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
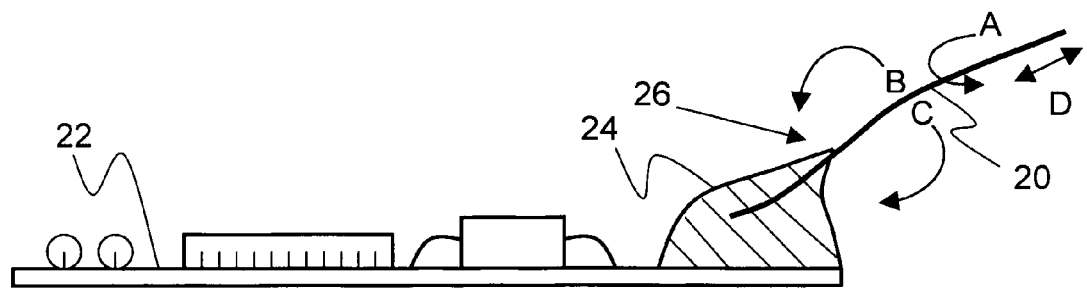
FIG. 1 illustrates an example of an electrical connection in which a lead is soldered to a printed circuit board.

Repeat use of reference characters throughout the present specification and appended drawings is intended to represent same or analogous features or elements of the invention.

DETAILED DESCRIPTION OF PREFERRED EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

Figure 2:
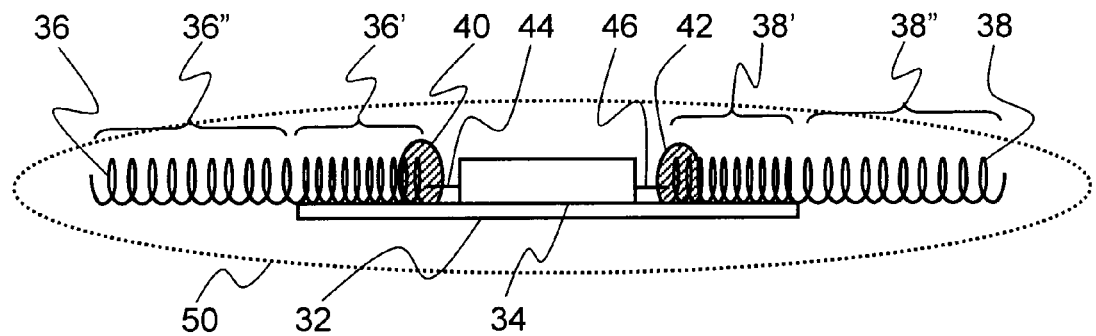
FIG. 2 illustrates an example of an antenna connection in which a coiled antenna wire is soldered to a printed circuit board.
Figure 3:
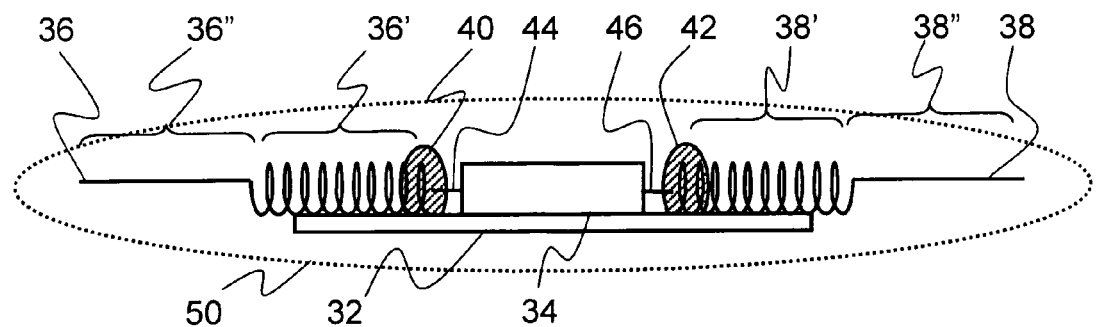
FIG. 3 illustrates another example of an antenna connection in which a partially coiled antenna wire is soldered to a printed circuit board.

FIGS. 2 and 3 provide illustrations of first and second exemplary embodiments of antenna connections to RFID devices according to the present subject matter. As illustrated in FIGS. 2 and 3, a printed circuit board 32 is shown as might be found in any electronics but, for the present subject matter, an RFID device 34 principally embodied as an integrated circuit component is illustrated. The RFID device 34 wirelessly transmits data to a remote receiver and/or receives data from a remote transmitter by way of a dipole antenna configuration consisting of antenna elements 36, 38. In these exemplary embodiments, antenna elements 36, 38 are formed as coiled wires with two separate portions each with a different pitch, i.e., number of coil turns per unit length.

A first section 36', 38' of antenna elements 36, 38 respectively in each of the FIGS. 2 and 3 embodiments, is formed of coil turns having a higher pitch, i.e., a higher number of turns per unit length, than antenna sections 36", 38" of antenna element 36, 38, respectively. In fact, sections 36", 38" of the embodiment illustrated in FIG. 3 have a zero pitch, i.e., zero turns per unit length or, more directly, a straight wire. Antenna elements 36, 38 with their various coil pitches may be constructed in various manners. As non-limiting examples only, the antenna elements 36, 38 may be formed from a single section of wire and coiled at one end with coil turns of one pitch and at the other end with coil turns of a second (including zero) pitch. In the case of the embodiment illustrated in FIG. 3, the zero pitch portion may also be provided by securing a separate, straight wire to a coiled section. Such a straight wire may be soldered, butt welded or secured in any known manner. In addition, the straight wire portion may be formed from a monofilament section or a multi-strand section. Moreover the diameter of the zero pitch section may be significantly greater than that of the conductor forming the higher pitched coil portion of the antenna element. An example of this larger diameter configuration may be seen in FIG. 5 and will be discussed more fully later.

While a number of connection methodologies may be used with the present invention, FIGS. 2 and 3 illustrate a soldered connection 40, 42 between antenna 36, 38 and RFID component 34 to printed circuit board 32. Printed circuit board 32 has been used to illustrate this particular exemplary embodiment but the present invention is not limited to use with only a printed circuit board. As illustrated in FIGS. 2 and 3, the end portion of the higher pitched coils 36', 38' of antenna elements 36, 38 along with respective leads 44, 46 from the RFID device 34 are soldered together and to a solder pad on printed circuit board 32. An example of the solder pad is more readily seen from the embodiments illustrated in FIGS. 4 and 5 as will be described more fully later.

The provision of two different pitches in the antenna elements offers improved performance from the RFID and antenna configuration in two respects. First, the higher pitched turns are provided in the high stress transitions zones allowing for a higher distribution of any stress applied to such portion of the antenna element. This higher pitched turns section also operates as an inductive element thereby shortening the overall length of the antenna elements for the operating frequency thereby allowing a smaller overall package to be constructed. The lower or zero pitch coil sections may be provided in lower stress areas as less stress needs to be dispersed and the lower pitch coils provides a longer antenna and, thereby, a larger target area in which to position data transmission devices.

Finally, it will be noted that the RFID and antenna combinations illustrated in FIGS. 2 and 3 are surrounded by a dotted line oval 50. Such is meant to represent the fact that the RFID device may be completely enclosed in a suitably shaped elastomeric material to provide further protection of the RFID device. Such elastomeric material is designed to not only surround the various components of the RFID device 34 and antenna elements 36, 38, but to actually fill the voids within the coil turns of the antenna elements. Elastomeric materials placed in this manner will tend to assist in minimizing movement of the antenna elements and, thereby, assist in reducing stresses applied to the elements.

Figure 4:
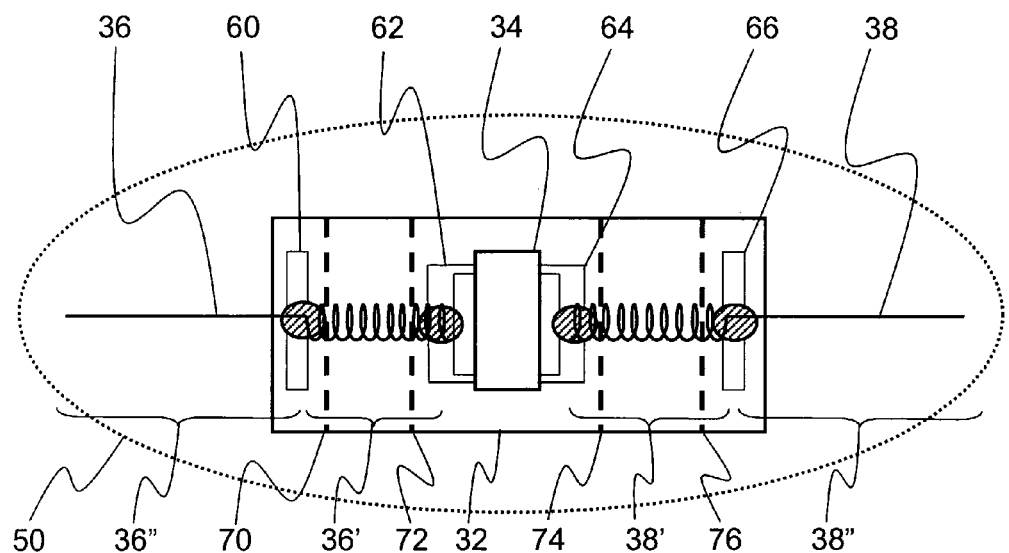
FIG. 4 illustrates an exemplary mounting method according to the present subject matter.
Figure 5:
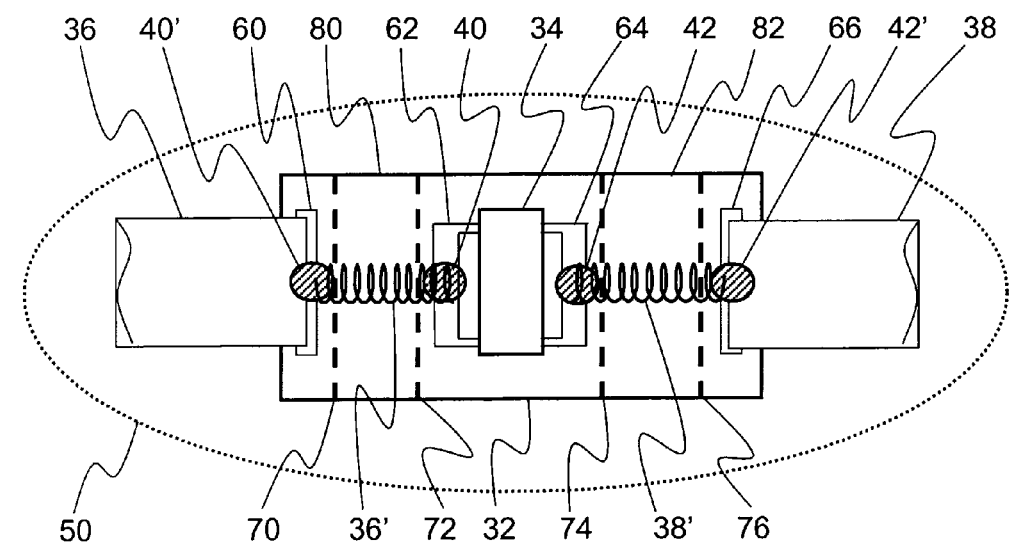
FIG. 5 illustrates another exemplary mounting method according to the present subject matter.

Third and fourth embodiments of the present subject matter will now be described with reference now to FIGS. 4 and 5. FIGS. 4 and 5 both illustrate plan views of RFID and antenna configurations wherein an RFID device 34 is secured to printed circuit board 32 using industrial accepted methods. Antenna elements 36, 38, as in the first and second embodiments of the present subject matter, also include portions 36' and 38' of higher pitched coil turns as well as section 36" and 38" containing lower pitched, in fact zero pitched, coil turns in the form of straight wire portions. As is apparent from examination of FIGS. 4 and 5, the straight wire portions 36" and 38" of the two embodiments differ by the substantial difference in their respective wire diameters. In both cases, however, the straight wire portions 36" and 38" may be provided from either solid or stranded wire segments.

An additional feature in the presently illustrated embodiments of the present subject matter is shown as a plurality of perforations 70, 72, 74, 76 strategically placed in pairs between solder connections 40, 40' and 42, 42'. Solder pads 60, 66 on each end portion of printed circuit board 32 provide securing sites where solder connections 40', 42' may be used to secure one end of antenna sections 36', 38' to one end of antenna sections 36", 38" respectively. As the RFID device 34 and assembled antennae are sealed in elastomeric material 50, the portions 80, 82 of printed circuit board 32 between perforations 70, 72 and 74, 76 respectively, are designed to break away as the elastomeric material is cured. Breaking away of the printed circuit board portions 80, 82 permits coiled antenna portions 36', 38' to more effectively disperse any forces applied to the antenna elements that may have a negative impact on the connection points to the RFID device.

Using the teachings disclosed herein, one of ordinary skill in the art will appreciate that other embodiments of the present invention exist that fall under the scope of the appended claims. In fact, it should be appreciated by those skilled in the art that modifications and variations can be made to the connection and method as described herein, without departing from the scope and spirit of the claims. It is intended that the invention include such modifications and variations as come within the scope of the appended claims and their equivalents.

What is claimed is:

1. A method of creating a fatigue-resistant connection, comprising:

providing an electrical conductor having first and second coiled portions;

providing an electrical circuit component, said electrical circuit component having at least one electrical lead extending there from;

providing a printed circuit board;

mounting the electrical component to the printed circuit board;

securing a portion of the first coiled portion of the electrical conductor to the at least one electrical lead of the electrical circuit component and the printed circuit board; and securing a portion of the electrical conductor between the first and second coiled portions to the printed circuit board.

2. A method of creating a fatigue-resistant electrical connection as in claim 1, wherein providing an electrical conductor comprises providing an electrical conductor having first and second coiled portions, each coiled portion having a different coil pitch.

3. A method of creating a fatigue-resistant electrical connection as in claim 2, wherein providing an electrical conductor further comprises providing the second coiled portion as a zero pitch portion.

4. A method of creating a fatigue-resistant electrical connection as in claim 1, wherein securing comprises soldering a plurality of coils from the first coiled portion to the printed circuit board.

5. A method of creating a fatigue-resistant electrical connection as in claim 1, further comprising encasing the electrical conductor, the electrical circuit component, and the printed circuit board in an elastomeric material.

6. The method of creating a fatigue-resistant electrical connection as in claim 5, wherein encasing the electrical conductor comprises filling void spaces within the coils of the electrical conductor with the elastomeric material.

7. A method of creating a fatigue-resistant electrical connection as in claim 1, further comprising perforating the printed circuit board at a plurality of locations between the locations where the first coiled portion of the electrical conductor and the portion between the first and second coiled portions of the electrical conductor are secured to the printed circuit board.

8. An RFID transponder, comprising:
a substrate;
an RFID element mounted to said substrate, said RFID element having at least one antenna connection terminal; and
an antenna element, said antenna element comprising an electrical conductor having first and second coil pitch portions, said first coil pitch portion coupled to said at least one antenna connection terminal;
wherein said substrate includes a first solder pad and said first coil pitch portion of said antenna element and said antenna connection terminal of said RFID element are soldered to said first solder pad; and
wherein said substrate includes a second solder pad and a portion of the antenna element between said first and second coil pitch portions is soldered to said second solder pad.

9. An RFID transponder as in claim 8, wherein the coil pitch of the first coil pitch portion of said electrical conductor is higher than the coil pitch of the second coil pitch portion of said electrical conductor.

10. An RFID transponder as in claim 9, wherein the pitch of the second coil pitch portion of said electrical conductor is set at zero.

11. An RFID transponder as in claim 8, further comprising an elastomeric material encasing said substrate, said antenna element and said RFID element.

12. An RFID transponder as in claim 8, wherein said first coil pitch portion of said antenna element and said antenna connection terminal of said RFID element are secured to said substrate.

13. An RFID transponder as in claim 8, wherein said substrate is perforated between said first and second solder pads.

14. A tire mounted fatigue-resistant electrical connection, comprising:
a circuit board;
an electrical circuit component, said electrical circuit component having at least one electrical lead extending there from; and
an electrical conductor having first and second coiled portions;
wherein the electrical component is mounted to the circuit board and a portion of the first coiled portion of the electrical conductor is secured to the at least one electrical lead of the electrical circuit component and the circuit board; and
wherein a portion of the electrical conductor between the first and second coiled portions is secured to the circuit board.

15. A tire mounted fatigue-resistant electrical connection as in claim 14, wherein the first and second coiled portions of the electrical conductor each have a different coil pitch.

16. A tire mounted fatigue-resistant electrical connection as in claim 15, wherein the second coiled portion of the electrical conductor has a zero pitch.

17. A tire mounted fatigue-resistant electrical connection as in claim 14, wherein a plurality of coils from the first coiled portion is soldered to the circuit board.

18. A tire mounted fatigue-resistant electrical connection as in claim 14, wherein the electrical conductor, the electrical circuit component, and the circuit board are encased in an elastomeric material.

19. A tire mounted fatigue-resistant electrical connection as in claim 18, wherein void spaces within the coils of the electrical conductor are filled with the elastomeric material.

20. A tire mounted fatigue-resistant electrical connection as in claim 18, wherein the elastomeric material is a tire component forming material.

21. A tire mounted fatigue-resistant electrical connection as in claim 20, further comprising a plurality of perforations spanning the circuit board at a plurality of locations between the locations where the first coiled portion of the electrical conductor and the portion between the first and second coiled portions of the electrical conductor are secured to the circuit board.

* * * * *